INVENTOR.
GEORGE D. WOFFORD
BY
Killman and Kerst

Feb. 26, 1957 G. D. WOFFORD 2,783,377

SIGNAL BIASED NOISE INVERTER FOR SYNCH SEPARATOR WHICH CANCELS NOISE ABOVE SYNCH PULSE LEVEL

Filed Nov. 8, 1951 2 Sheets-Sheet 2

INVENTOR.
GEORGE D. WOFFORD
BY
Killman and Kerst
ATTORNEYS 2,783,377

SIGNAL BIASED NOISE INVERTER FOR SYNCH SEPARATOR WHICH CANCELS NOISE ABOVE SYNCH PULSE LEVEL

George D. Wofford, Baltimore, Md., assignor to Bendix Aviation Corporation, Towson, Md., a corporation of Delaware Application November 8, 1951, Serial No. 255,360

6 Claims. (Cl. 250—27)

This is a continuation-in-part of the copending application Serial No. 243,200, filed August 23, 1951, now abandoned.

This invention relates generally to signaling circuits and more particularly to improved circuits for the elimination of noise impulses from the desired signals translated by such circuits.

In prior art devices it has been well known to provide a noise inverter which is selectively responsive to combine inverted noise signals of a predetermined amplitude with the composite desired and noise signals for the cancellation of the latter. In devices heretofore provided, inherent limitations have prevented a full realization of the objects intended to be obtained thereby. In addition to providing performance which overcomes the limitations of these prior art circuits, the present invention provides economical circuit arrangements which make the adoption of such circuits commercially feasible in large scale production. Prior art circuits to this end have required many additional circuit elements and have thus fallen short of a satisfactory solution economically as well as from a performance standpoint.

It is, accordingly, an object of this invention to provide an improved noise inverter for signaling circuits.

Another object is to provide a new noise inverter-plate detector combination.

A further object is to provide an improved performance signaling device employing a novel controlled noise actuation level inverter circuit which requires a minimum of additional components.

Another object is to provide a noise inverting signal translator which is simple and easy to manufacture and provides reliable operation without critical adjustment when produced in large quantities.

A further object is to provide a noise inverter for a signal translator which operates with respect to a plate detector derived bias obtained from a noise immune portion of the signal circuit.

Another object is to provide an improved television receiver circuit in which noise inversion in the video signal is avoided while a signal level controlled noise inversion in the synchronization circuit is obtained.

Still another object is to provide a noise inverter having improved biasing arrangements.

These and other objects of the present invention are obtained in the preferred embodiment thereof by deriving in the circuit of a plate detector tube which is subsequent to the noise inverter, and hence protected thereby from noise, a bias voltage which is representative of the signal level being translated. This bias is utilized to control the operating point at which the noise inverter is effective to invert the noise signals. In this manner the noise inverter eliminates signals from the detector output circuit which exceed the average value of the noise-free signal by a predetermined ratio and this operation is preserved over wide ranges of signal level under the control of the bias developed by the plate detector in accordance with the present teaching.

The circuits incorporating the present invention are particularly useful in applications wherein peak amplitude of signal variations are desired to be detected. As present day television receivers represent an important application of this type of circuit to which the teaching of the present invention may be readily applied the invention will be described with reference to television type circuits, without intending to limit the invention thereto or thereby. An important feature of the present invention for present day television receivers provides signal level controlled noise inversion for improved synchronizing action without introducing undesirable "white" inverted noise in the video channel.

Figure 1:
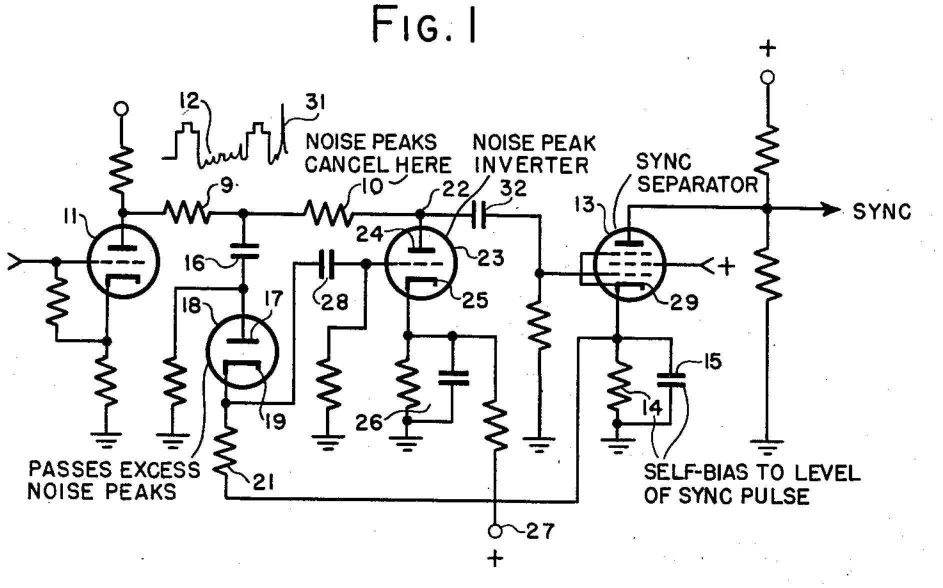
Fig. 1 is a schematic diagram of a circuit of the present invention.

Referring to Fig. 1, there is shown a video amplifier 11 supplying a typical video signal 12 of the positive synchronizing ("sync") signal type to the input grid of a sync separator tube 13 through the resistors 9 and 10 and condenser 32. The tube 13 operates as a peak detector by virtue of a bias circuit comprising resistor 14 and condenser 15 in the cathode circuit thereof. At the junction of resistors 9 and 10 a condenser 16 is connected to plate 17 of diode 18. The diode 18 has a cathode 19 which is connected through resistor 21 to a point on the resistor 14. From a point 22 intermediate the resistance 10 and the input of tube 13 a noise inverter triode 23 has its plate 24 connected. Tube 23 has a cathode 25 which is connected to ground through a resistor-condenser bias circuit 26. The cathode 25 is maintained at a positive potential such that tube 23 is normally cutoff by means of a bias voltage applied at terminal 27. The cathode 19 of diode 17 is coupled by condenser 28 to the grid of tube 23.

The operation of the circuit of Fig. 1 provides elimination of noise signals in excess of the sync tip level of the incoming signal 12 as follows. For noise-free signals the tube 24 is biased to cutoff by the voltage applied to the terminal 27. These signals are subject to peak detection in tube 13, whereby the peak of sync signals alone appear in the output thereof. In operating as a peak detector the tube 13 developes a bias on its cathode 29, which is representative of the signal strength and its picture content. This voltage on the cathode 29 or a portion of it from a tap on resistor 14 is applied to the cathode 19 of the diode 17 and is of a value effective to maintain the diode non-conductive for noise-free signals. A positive noise signal 31 which exceeds the sync tip level, being coupled to the plate of diode 17 through condenser 16, will cause it to conduct thereby developing a positive signal at the cathode 19 proportional to the amount by which the noise signal exceeds the bias at that point. This positive signal is coupled by condenser 28 to the grid of tube 23 causing it to conduct thereby producing a voltage drop across resistor 10 which is effectively an amplified inversion of the upper portion of the noise peak 31. In this manner, at the point 22 in the circuit, any positive noise peaks of sufficient amplitude with respect to the then existing signal level and the bias developed thereby are cancelled or, preferably, appear as negative noise peaks, depending on the gain of the inverter amplifier 23. The noise signals to the input of the tube 13, being negative, have no adverse effect on the operation thereof as a positive peak detector since they are eliminated from the output of tube 13 along with other negative portions of the signal corresponding to the white portion of the picture.

The bias developed on the cathode 29 of tube 13 results from space current flowing through resistor 14 during the positive sync tip portion of the signal 12. Resistor 14 is chosen at a relatively high value and condenser 15 is chosen in conjunction therewith to maintain a high value of bias between successive sync signals. As the signal strength and picture content vary the bias on cathode 29 varies to maintain the tube 13 operating as a peak detector to the A. C. coupled signals 12. Consequently, the operating level for diode 17 to the A. C. coupled signals 12 is always a point which just exceeds the peak signals being detected and amplified by tube 13. As the tube 23 remains cutoff except when signals are supplied thereto, due to conduction in the diode 17, the noise inverting operation thereof is selective with respect to noise in excess of the desired sync signals and obtains over a wide range of signal levels due to the automatic bias adjustment obtained in the cathode circuit of the tube 13. No inversion of the sync tip signals occurs within this range.

Figure 2:
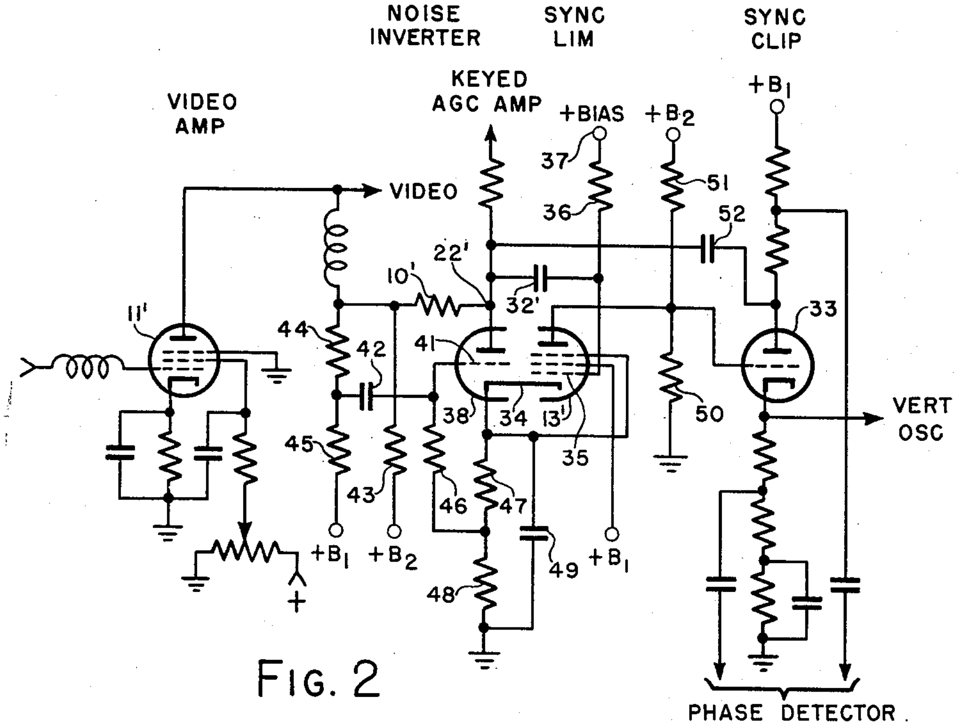
Fig. 2 is a schematic diagram of the incorporation of a modification of the invention in a television receiver circuit.

Referring to Fig. 2, there is shown a circuit in which the principles of the present invention have been incorporated into the circuit of a television receiver. A video amplifier 11′ supplies the video signal via a noise inverting resistor 10′ and a condenser 32′ to the input grid of a sync separator pentode 13′. The output of the tube 13′ is applied to the input of a sync clipper 33 from which it is supplied to other portions of the circuit as is well known in the art. The variable bias at cathode 34 is developed by tube conduction during the sync tip signals as hereinbefore explained and is in addition to a fixed bias component maintained as follows. Grid 35 of tube 13′ is connected through a high value resistance 36 to a point 37 of suitable positive potential. The positive potential applied to the grid 35 from the point 37 is sufficient to maintain conduction in the tube 13′ at a level suitable for peak detection of signals appearing on the grid 35. This conduction developes a quiescent bias level for the cathode 34. Conduction by the tube 13′ in response to positive peak signals increases the bias on the cathode 34, so that it varies in response to such signals and with respect to the quiescent value.

The cathode 34 is common to a triode 38 which acts as a noise inverter. For this purpose a portion of the video signal is coupled to grid 41 by means of condenser 42. The triode 38 is normally non-conductive due to the quiescent bias and the noise-free signal-developed bias on the cathode 34. In this manner, the operation of the noise inverter is selectively controlled to respond to only those signals which exceed the then existing sync tip level as hereinbefore explained. The conduction point for the tube 38 may be adjusted by the voltage divider 44, 45 to which condenser 42 is connected. When noise signals exceeding the sync tip level appear on the grid 41 the tube 38 conducts, thereby producing the inverted noise signals at the point 22′ in a manner similar to that as hereinbefore described with reference to Fig. 1. Condenser 52 provides a positive feedback effect to eliminate capacitive loading at the grid 35.

In the circuit of Fig. 2, it can be seen that the need for a diode has been eliminated by directly varying the level of conduction of the noise inverter triode 38 by application to its cathode 34 the signal controlled bias voltage. The signal controlled bias voltage is developed in the cathode circuit of the sync separator tube 13′ and therefore requires no additional tubes or other expensive circuit components for its derivation. Obviously other bias developing circuits, for example grid leak bias, could be employed. The only significant additional component in the circuit of Fig. 2, in addition to those already present in a typical receiver, is the triode section 38 and this may be obtained, as indicated, in a common envelope with the sync separator pentode 13′.

Figure 3:
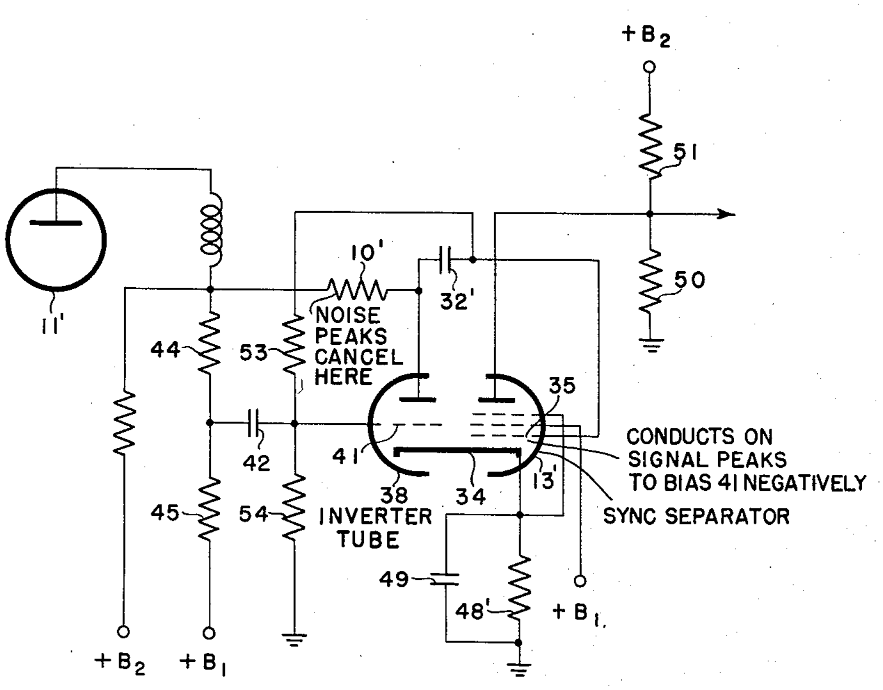
Fig. 3 shows a modification employing both grid and cathode bias control.

Referring to Fig. 3, there is shown a modification especially useful where high level signals are encountered. This circuit returns the grid 35 of the plate detector 13′ to ground through voltage divider resistors 53 and 54. The junction of the resistors 53 and 54 is connected to the grid 41 of the inverter tube 38. The tube 13′ thus operates as a plate detector with a plate detection bias developed in the cathode circuit thereof across the condenser 49 and a resistor 48′. The nature of plate detection action is such that the cathode bias increases for increasing signal levels and thus peak detection obtains over a wide range as hereinbefore described. Ultimately, a signal level is reached for which the cathode bias fails to increase as rapidly as the peak signal due to the peak current limitations in the tube 13′. Under these conditions the grid 35 will conduct on positive peaks and thereby develop a negative grid rectification potential. The potential of the cathode 34 no longer represents this high signal level and inversion of the sync tips would be possible in the circuit of Fig. 2 for these conditions. The Fig. 3 circuit avoids such difficulties by virtue of the connection of the grid 41 to a suitable point on the voltage divider 53, 54 which has developed thereacross the negative rectification potential of the grid 35. The negative potential thus applied to the grid 41 aids the action of the bias on the cathode 34 in maintaining the inverter tube 38 at cutoff. In other words, for small signal levels the grids 35 and 41 are at ground potential and a signal representative bias exists on the cathode 34. For high level signals rectification by grid 35 makes the grid 41 negative, thereby maintaining the grid 41 to cathode 34 potential representative of the signal level over a range including higher signal levels than would be possible without the additional grid rectification bias. As the total grid to cathode bias remains representative of the signal level, inversion can be obtained for signals which exceed the sync tips over this extended operating range.

From the foregoing description, it can be seen that the present invention provides noise inverters which are simple and reliable in operation and which are capable of superior performance over an extremely wide range of signals levels without adjustment. By incorporating the operating level control in the bias circuit of the inverter tube itself, for example as shown in Fig. 2, the additional component requirement can be reduced to a minimum without significantly impairing the operation obtained with a signal controlled operating level. Extended range operation may be obtained with the circuit as shown in Fig. 3. By introducing the noise inversion in only the synchronizing channel there is eliminated spurious synchronization on noise signals without deleterious effects on the picture in the form of white inverted noise. The derivation of the control potential from a noise immune portion of a signal channel prevents the circuit from assuming an inversion level determined by a sustained burst of noise for all useable signals.

Typical values of the circuit parameters and tube types which have proven satisfactory in the circuit of Fig. 2 are as follows:

(k=1,000 ohms; m=1,000,000 ohms)

| | |
|---|---|
| 10' | 47k |
| 11' | 6AH6 |
| 13', 38 | 6X8 |
| 32 | .01 μf. |
| 36 | 2.2m |
| 42 | .047 μf. |
| 43 | 24k |
| 44 | 12k |
| 45 | 12k |
| 46 | 390k |
| 47 | 27k |
| 48 | 10k |
| 49 | 2 μf. |
| 50 | 100k |
| 51 | 47k |
| 52 | 5 μμf. |
| +B1 | +260 v. |
| +B2 | +145 v. |
| +Bias | (approximately) 12 v. |

Many modifications utilizing the teaching of the present invention will be apparent to those skilled in the art and are to be understood as being within the scope of the advance in the art here provided.

What is claimed is:

1. A noise inverter for a sync signal separating system having a signal source subject to producing undesired noise impulses of excessive amplitude superimposed on a desired signal comprising, a sync separator for said signals, means including a signal coupling impedance for coupling signals from said source to said separator, a bias circuit for said separator for developing a bias potential representative of the value of said signals, a source of current, a grid controlled discharge device, means connecting said impedance and said discharge device in circuit with said source of current for controlling the current in said impedance, a unilaterally conductive device, means including said unilateral device for selectively coupling at least a portion of said signals to the input circuit of said discharge device, means for variably biasing said unilateral device from said bias potential to provide said selective coupling only for values of said portion of said signal different by at least a predetermined amount from the value of said bias, said selectively coupled signals rendering said discharge device conductive for producing a voltage change across said impedance effective to oppose the signal coupled to said sync separator by said first mentioned coupling means.

2. A noise inverter for a sync signal separating system having a signal source subject to producing undesired noise impulses of excessive amplitude superimposed on a desired signal comprising, a source of said signals, a sync separator for said signals, means including a signal coupling impedance and D. C. blocking means for coupling signals from said source to said separator, a cathode bias circuit for said separator for developing a bias potential representative of the value of said signals, a source of current, a grid controlled discharge device, means connecting said impedance and said discharge device in circuit with said source of current for controlling the current in said impedance, means for rendering said discharge device normally non-conductive, a unilaterally conductive device, a second impedance, a connection joining said second impedance and the negative terminal of said unilateral device, means coupling said signals to the positive terminal of said unilateral device, a connection applying at least a portion of said bias potential to said negative terminal, and D. C. blocking means coupling the junction of said second impedance and said negative terminal to the grid of said discharge device, whereby time variant signals sufficient to cause conduction in said unilateral device are coupled to said discharge device and cancel the signals coupled to said sync separator by virtue of the inverted voltage so produced in said first mentioned impedance.

3. A noise inverter for a sync signal separating system subject to noise impulses of excessive amplitude superimposed on the desired input signal, comprising: a signal translating circuit; a sync separator; means including an impedance element coupling the output of said signal translating circuit to the input of said sync separator; impedance means coupled to said sync separator and responsive to the flow of space current therethrough to generate a voltage the magnitude of which is a function of the average peak magnitude of said input signal, an amplifier circuit having means to restrict the response thereof to signals having the polarity of the incoming sync signal; means coupling the output of said translating circuit to the input of said amplifier circuit; means coupling the output of said amplifier circuit to the said impedance element in a manner such that the signals developed thereacross by the output of said amplifier circuit bear an inverse polarity relationship to the signals applied thereto by said translating circuit; and means coupling said voltage to said input of said amplifier circuit to control the threshold level of the response of said amplifier circuit, whereby said amplifier circuit amplifies portions of said noise impulses having amplitudes that exceed the average peak signal level; thereby reducing the amplitude of the said noise impulses in the signal coupled to said input of said sync separator.

4. A noise inverter for a sync signal separating system subject to noise impulses of excessive amplitude superimposed on the desired input signal comprising: a signal translating circuit; a sync separator; means including an impedance element coupling the output of said signal translating circuit to the input of said sync separator; a cathode bias circuit forming part of said sync separator and responsive to the flow of space current through said sync separator to generate a voltage the magnitude of which is a function of the average peak magnitude of said input signal; an amplifier circuit having means to restrict the response thereof to signals having the polarity of the incoming sync signal; means coupling the output of said translating circuit to the input of said amplifier circuit; means coupling the output of said amplifier circuit to the said impedance element in a manner such that the signals developed thereacross by the output of said amplifier circuit bear an inverse polarity relationship to the signals applied thereto by said translating circuit; and means coupling said voltage to said input of said amplifier circuit to control the threshold level of the response of said amplifier circuit, whereby said amplifier circuit amplifies portions of said noise impulses having amplitudes that exceed the average peak signal level; thereby reducing the amplitude of the said noise impulses in the signal coupled to said input of said sync separator.

5. A noise inverter for a sync signal separating system subject to noise impulses of excessive amplitude superimposed on the desired input signal, comprising: a signal translating circuit; a sync separator; said separator comprising an electron tube having a cathode bias circuit responsive to the flow of space current through said tube to generate a voltage the magnitude of which is a function of the average peak magnitude of said input signal; said tube having at least a plate, a cathode and a grid electrode; an amplifier circuit comprising a second electron tube and two resistors serially connected as a load impedance therefor; said second tube comprising at least a plate, a cathode and a grid electrode; means coupling the said cathode bias circuit to the said amplifier circuit in a manner to control the threshold sensitivity thereof; means coupling the said plate of said second tube to said grid electrode of said first tube; means coupling the output of said signal translating circuit to the junction of said serially connected resistors; and to the said grid of said second tube; whereby said amplifier circuit amplifies portions of said noise impulses having amplitudes that exceed the average peak signal level; thereby reducing the amplitude of the said noise impulses in the signal coupled to said input of said sync separator.

6. A noise inverter for a sync signal separating system in a television receiver comprising a video amplifier subject to noise impulses of excessive amplitude superimposed on the desired signal, comprising: a sync separator; said separator comprising an electron tube having a cathode bias circuit for generating a voltage the level of which is a function of the average peak magnitude of said input signal; said tube comprising at least a plate, a cathode and a grid electrode; a second amplifier; said second amplifier comprising an electron tube and two resistors serially connected as a load impedance therefor; said second tube comprising at least a plate, a cathode and a grid electrode; means coupling the said cathode bias circuit to the said second amplifier for controlling the threshold sensitivity thereof; means coupling said plate of the said second tube to said grid of said first tube; means coupling the output of said video amplifier to the junction of said serially connecting resistors and to said grid of said second tube; whereby said second amplifier amplifies portions of said noise impulses having amplitudes that exceed the average peak signal level; thereby reducing the amplitude of said noise impulses in said signal.

References Cited in the file of this patent

UNITED STATES PATENTS

| | | |
|---|---|---|
| 2,221,728 | Travis | Nov. 12, 1940 |
| 2,259,532 | Nicholson | Oct. 21, 1941 |
| 2,621,290 | Andreson | Dec. 9, 1952 |
| 2,718,552 | Anderson | Sept. 20, 1955 |

FOREIGN PATENTS

| | | |
|---|---|---|
| 910,938 | France | June 24, 1946 |